(12) United States Patent
Ahmed

(10) Patent No.: US 9,082,729 B2
(45) Date of Patent: Jul. 14, 2015

(54) COMBINATORIAL METHOD FOR SOLID SOURCE DOPING PROCESS DEVELOPMENT

(71) Applicant: Intermolecular, Inc., San Jose, CA (US)

(72) Inventor: Khaled Ahmed, Anaheim, CA (US)

(73) Assignee: Intermolecular, Inc., San Jose, CA (US)

(*) Notice: Subject to any disclaimer, the term of this patent is extended or adjusted under 35 U.S.C. 154(b) by 113 days.

(21) Appl. No.: 14/085,706

(22) Filed: Nov. 20, 2013

(65) Prior Publication Data

US 2015/0140696 A1    May 21, 2015

(51) Int. Cl.
| | | |
|---|---|---|
| H01L 21/44 | (2006.01) | |
| H01L 21/324 | (2006.01) | |
| H01L 21/02 | (2006.01) | |
| H01L 21/22 | (2006.01) | |
| H01L 21/66 | (2006.01) | |

(52) U.S. Cl.
CPC ........ H01L 21/324 (2013.01); H01L 21/02164 (2013.01); H01L 21/02301 (2013.01); H01L 21/22 (2013.01); H01L 22/14 (2013.01)

(58) Field of Classification Search
CPC .................................................. H01L 21/324
USPC .................................................. 438/680–681
See application file for complete search history.

(56) References Cited

U.S. PATENT DOCUMENTS 7,023,037 B2 * 4/2006 Cho et al. ........................ 257/295
7,544,574 B2 * 6/2009 Chiang et al. ................. 438/297

OTHER PUBLICATIONS

Sasaki et al.; Conformal doping mechanism for fin field effect transistors by self-regulatory plasma doping with AsH3 plasma diluted with He; Jan. 11, 2012; Journal of Applied Physics; American Institute of Physics; pp. 013712-1-013712-6.

* cited by examiner

Primary Examiner — Calvin Lee

(57) ABSTRACT

One or more small spot showerhead apparatus are used to provide dopant exposure and/or to deposit materials using CVD, PECVD, ALD, or PEALD on small spots in a site isolated, combinatorial manner. The small spot showerheads may be configured within a larger combinatorial showerhead to allow multi-layer film stacks to be deposited in a combinatorial manner. Anneal processes where the area of the process can be controlled such as laser annealing or site-isolated rapid thermal processing (RTP) can be used to vary the annealing conditions in a combinatorial manner.

20 Claims, 10 Drawing Sheets

COMBINATORIAL METHOD FOR SOLID SOURCE DOPING PROCESS DEVELOPMENT

FIELD OF THE INVENTION

The present invention relates generally to methods for the deposition of materials on site isolated regions of a substrate in a combinatorial manner. The apparatus is operable to deposit materials using chemical vapor deposition (CVD) or atomic layer deposition (ALD) technologies. Additionally, the apparatus is compatible with the plasma enhanced versions of these technologies (i.e. PECVD and PEALD).

BACKGROUND OF THE INVENTION

The manufacture of semiconductor devices, TFPV modules, optoelectronic devices, etc. entails the integration and sequencing of many unit processing steps. As an example, device manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD). However, the CVD and ALD adaptations of HPC techniques generally deposit materials on relatively large areas of the substrate. As an example, ALD deposition on a quarter of the substrate is common. However, it is desirable to deposit materials on a substrate using CVD or ALD in a site isolated manner wherein the size of the region is very small relative to the substrate. Therefore, there is a need to develop methods that enable the deposition of materials using CVD, PECVD, ALD, or PEALD on small spots in a site isolated, combinatorial manner to form multilayer film stacks.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments of the present invention, one or more small spot showerhead apparatus are used to provide dopant exposure and/or to deposit materials using CVD, PECVD, ALD, or PEALD on small spots in a site isolated, combinatorial manner. The small spot showerheads may be configured within a larger combinatorial showerhead to allow multi-layer film stacks to be deposited in a combinatorial manner. Anneal processes where the area of the process can be controlled such as laser annealing or site-isolated rapid thermal processing (RTP) can be used to vary the annealing conditions in a combinatorial manner.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
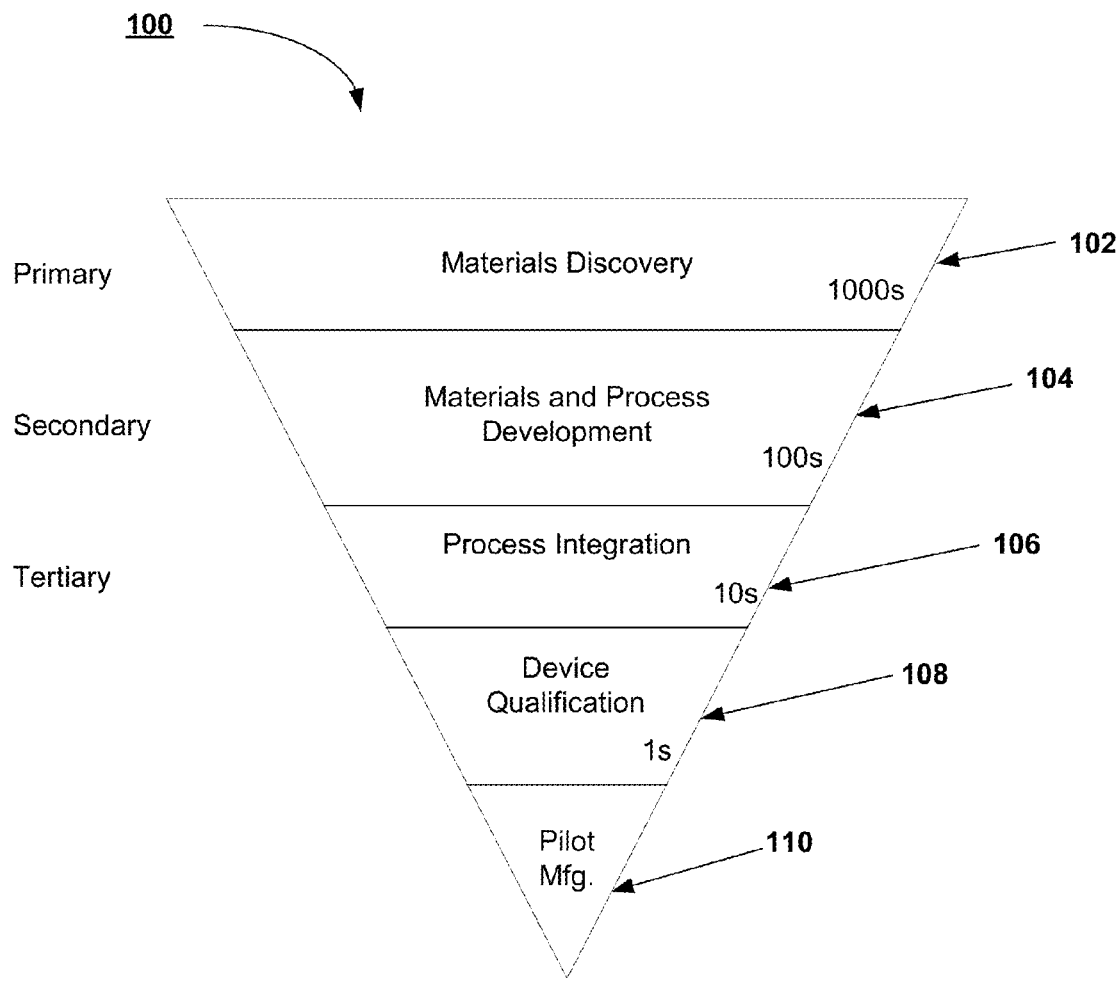
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Before various embodiments are described in detail, it is to be understood that unless otherwise indicated, this invention is not limited to specific layer compositions or surface treatments. It is also to be understood that the terminology used herein is for the purpose of describing particular embodiments only and is not intended to limit the scope of the present invention.

It must be noted that as used herein and in the claims, the singular forms "a," "an" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The term "about" generally refers to ±10% of a stated value.

The term "substrate" as used herein may refer to any workpiece on which formation or treatment of material layers is desired. Substrates may include, without limitation, float glass, low-iron glass, borosilicate glass, display glass, alkaline earth boro-aluminosilicate glass, fusion drawn glass, flexible glass, specialty glass for high temperature processing, polyimide, plastics, polyethylene terephthalate (PET), etc. for either applications requiring transparent or non-transparent substrate functionality.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

As used herein, a material (e.g. a dielectric material or an electrode material) will be considered to be "crystalline" if it exhibits greater than or equal to 30% crystallinity as measured by a technique such as x-ray diffraction (XRD).

As used herein, the terms "film" and "layer" will be understood to represent a portion of a stack. They will be understood to cover both a single layer as well as a multilayered structure (i.e. a nanolaminate). As used herein, these terms will be used synonymously and will be considered equivalent.

As used herein, the phrase "site-isolated region" (SIR) will be understood to refer to two or more regions defined on a substrate that are separated from each other and used for the evaluation of different materials or process parameters. The SIRs can be formed using many different methods such as scribing, deposition through a shadow mask, deposition using isolated deposition heads, lithography, and the like. The present disclosure is not limited by the method used to form the SIRs.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor devices, TFPV modules, optoelectronic devices, etc. manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor devices, TFPV modules, optoelectronic devices, etc. device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture semiconductor devices, TFPV modules, optoelectronic devices, etc. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor devices, TFPV modules, optoelectronic devices, etc. For example, such structures may include, but would not be limited to, contact layers, buffer layers, absorber layers, or any other series of layers or unit processes that create an intermediate structure found on semiconductor devices, TFPV modules, optoelectronic devices, etc. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
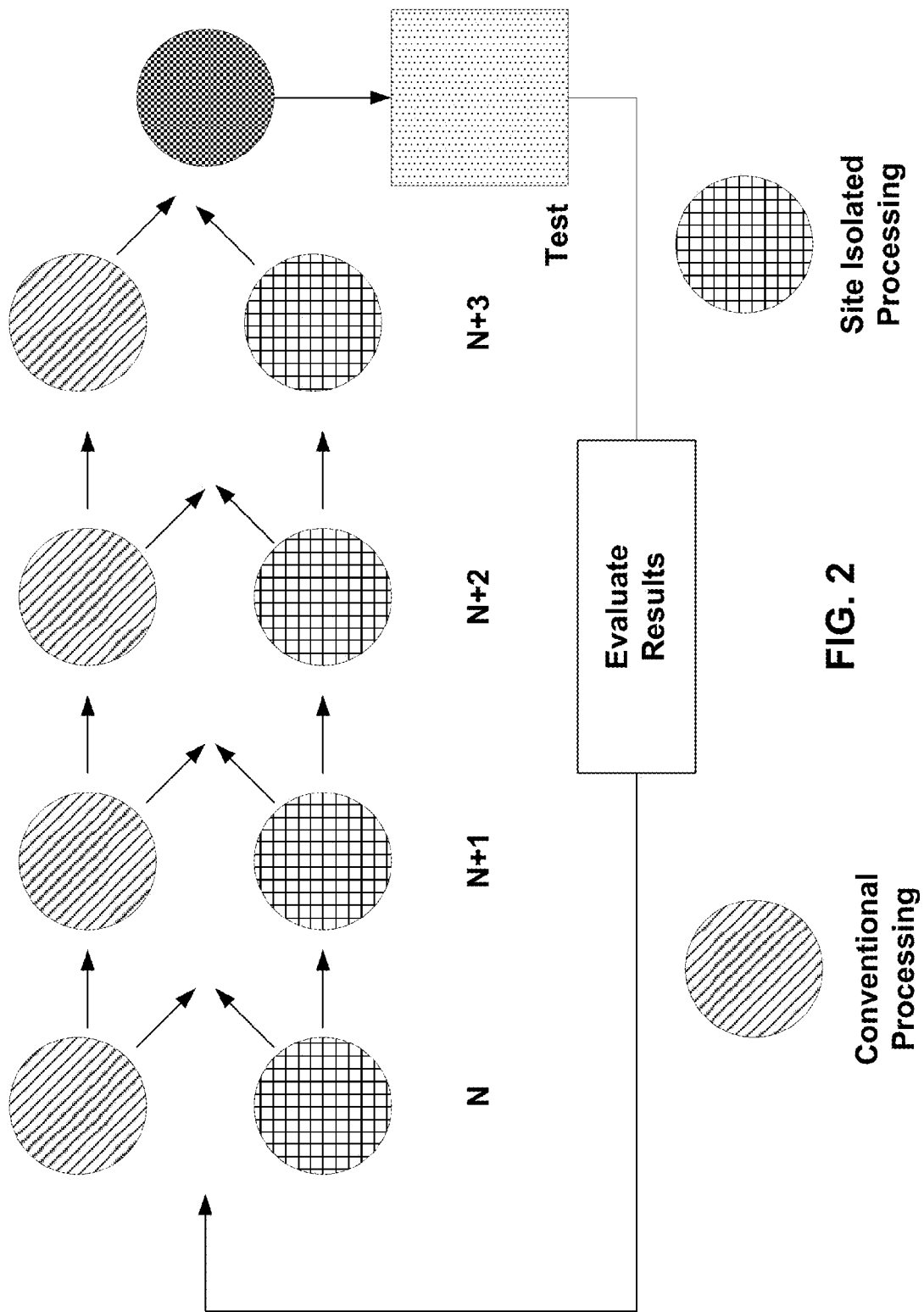
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor device, TFPV module, optoelectronic device, etc. manufacturing may be varied.

Figure 3:
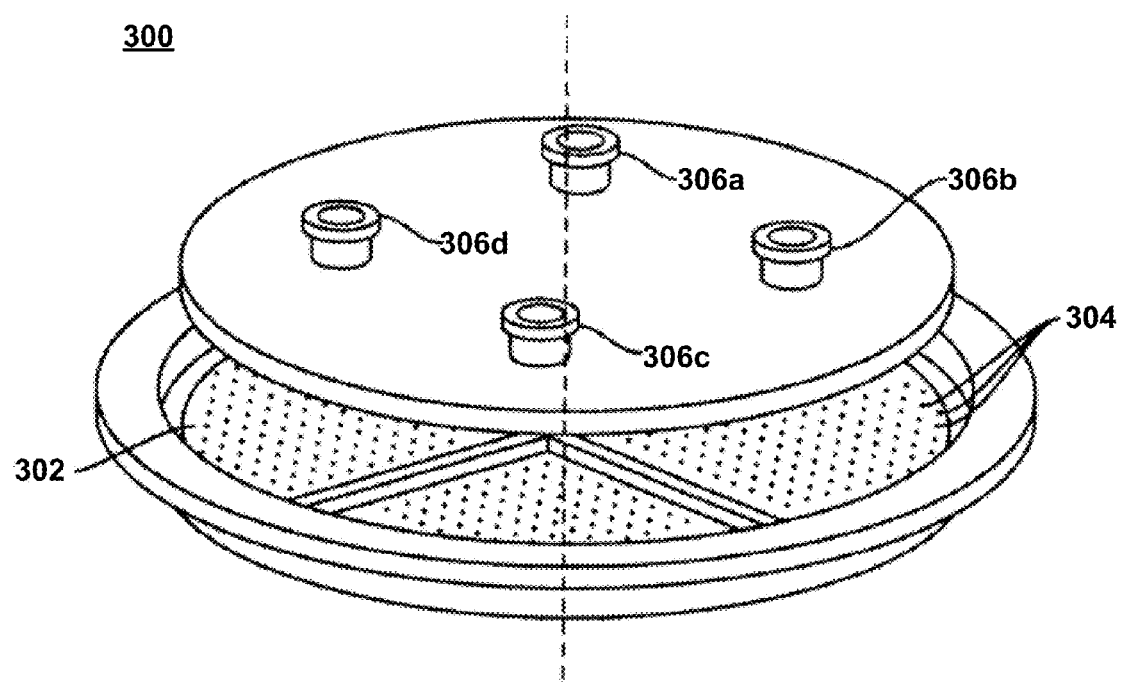
FIG. 3 illustrates an example of a large area ALD or CVD showerhead used for combinatorial processing.

FIG. 3 illustrates an example of a large area ALD or CVD showerhead, 300, used for combinatorial processing. Details of this type of showerhead and its use may be found in U.S. patent application Ser. No. 12/013,729 entitled "Vapor Based Combinatorial Processing" filed on Jan. 14, 2008 and claiming priority to Provisional Application No. 60/970,199 filed on Sep. 5, 2001, U.S. patent application Ser. No. 12/013,759 entitled "Vapor Based Combinatorial Processing" filed on Jan. 14, 2008 and claiming priority to Provisional Application No. 60/970,199 filed on Sep. 5, 2001, and U.S. patent application Ser. No. 12/205,578 entitled "Vapor Based Combinatorial Processing" filed on Sep. 5, 2008 which is a Continuation application of the U.S. patent application Ser. No. 12/013,729 and claiming priority to Provisional Application No. 60/970,199 filed on Sep. 5, 2001, all of which are herein incorporated by reference.

The large area ALD or CVD showerhead, 300, illustrated in FIG. 3 comprises four regions, 302, used to deposit materials on a substrate. As an example, in the case of a round substrate, four different materials and/or process conditions could be used to deposit materials in each of the four quadrants of the substrate (not shown). Precursor gases, reactant gases, purge gases, etc. are introduced into each of the four regions of the showerhead through gas inlet conduits 306a-306d. For simplicity, the four regions, 302, of showerhead, 300, have been illustrated as being a single chamber. Those skilled in the art will understand that each region, 302, of showerhead, 300, may be designed to have two or more isolated gas distribution systems so that multiple reactive gases may be kept separated until they react at the substrate surface. Also for simplicity, on a single gas inlet conduit, 306a-306d, is illustrated for each of the four regions. Those skilled in the art will understand that each region, 302, of showerhead, 300, may have multiple gas inlet conduits. The gases exit each region, 302, of showerhead, 300, through holes, 304, in the bottom of the showerhead. The gases then travel to the substrate surface and react at the surface to deposit a material, etch an existing material on the surface, clean contaminants found on the surface, react with the surface to modify the surface in some way, etc. The showerhead illustrated in FIG. 3 is operable to be used with any of a CVD, PECVD, ALD, or PEALD technology.

Figure 4:
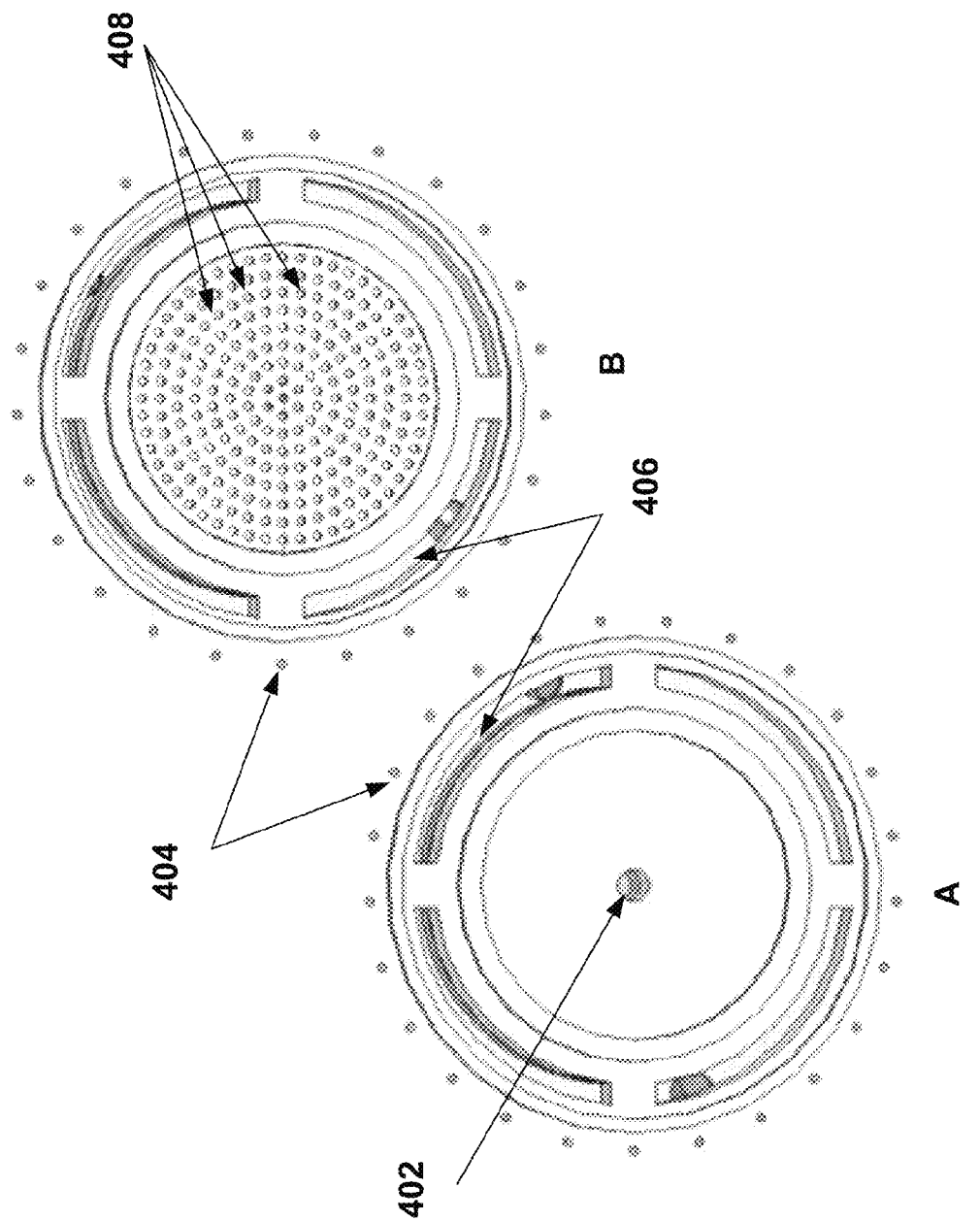
FIG. 4 illustrates a bottom view of two examples of a small spot showerhead apparatus in accordance with some embodiments of the present invention.

As discussed previously, showerhead, 300, in FIG. 3 results in a deposition (or other process type) on a relatively large region of the substrate. In this example, a quadrant of the substrate. To address the limitations of the combinatorial showerhead illustrated in FIG. 3, small spot showerheads have been designed as illustrated in FIG. 4. FIG. 4 illustrates a bottom view of two examples of a small spot showerhead apparatus in accordance with some embodiments of the present invention. The small spot showerhead configuration, A, illustrated in FIG. 4 comprises a single gas distribution port, 402, in the center of the showerhead for delivering reactive gases to the surface of the substrate. The small size of the small spot showerhead and the behavior of the technologies envisioned to use this showerhead ensure that the uniformity of the process on the substrate is adequate using the single gas distribution port. However, the small spot showerhead configuration, B, illustrated in FIG. 4 comprises a plurality of gas distribution ports, 408, for delivering reactive gases to the surface of the substrate. This configuration can be used to improve the uniformity of the process on the substrate if required.

Each small spot showerhead is surrounded by a plurality of purge holes, 404. The purge holes introduce inert purge gases (i.e. Ar, $N_2$, etc.) around the periphery of each small spot showerhead to insure that the regions under each showerhead can be processed in a site isolated manner. The gases, both the reactive gases and the purge gases, are exhausted from the process chamber through exhaust channels, 406, that surround each of the showerheads. The combination of the purge holes, 404, and the exhaust channels, 406, ensure that each region under each showerhead can be processed in a site isolated manner. The diameter of the small spot showerhead (i.e. the diameter of the purge ring) can vary between about 40 mm and about 100 mm. Advantageously, the diameter of the small spot showerhead is about 65 mm.

Figure 5:
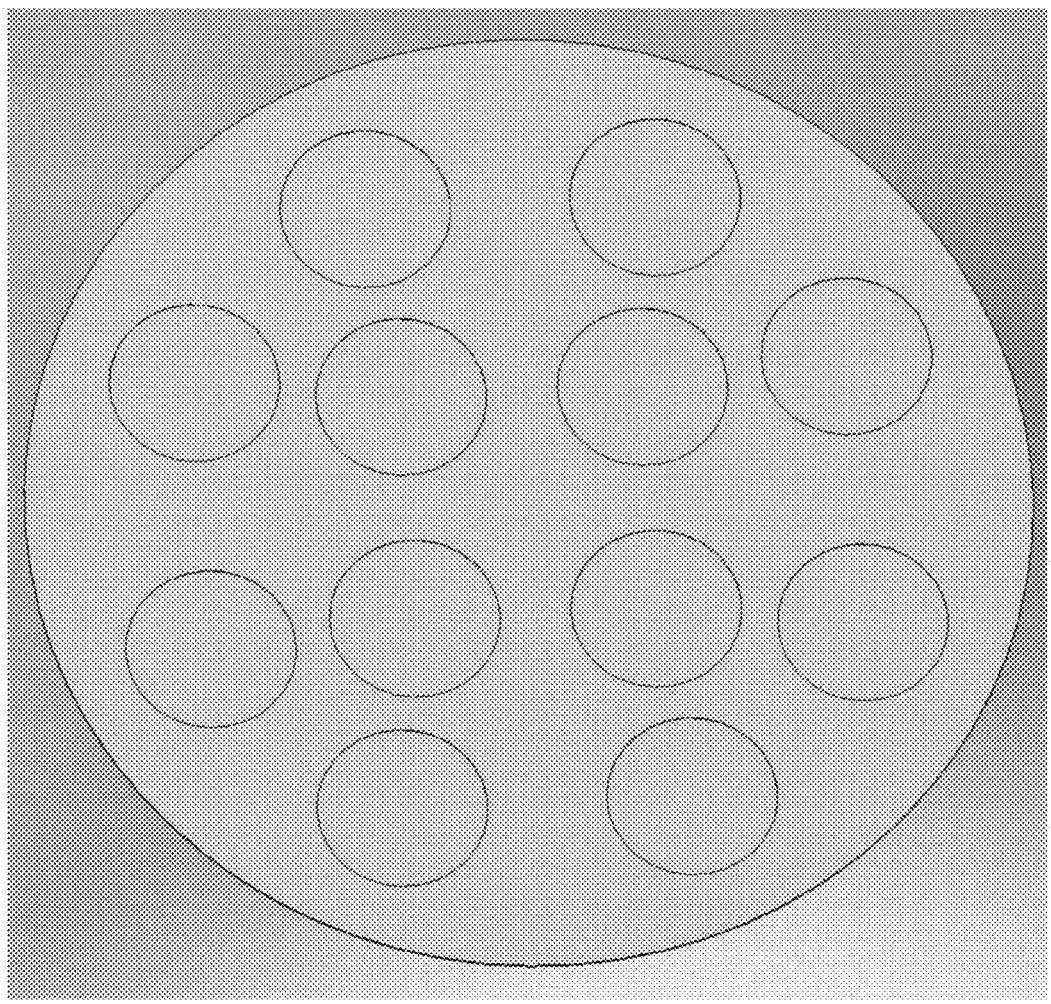
FIG. 5 illustrates one example of a pattern of site isolated regions that can be processed using a small spot showerhead apparatus in accordance with some embodiments of the present invention.

Using a plurality of small spot showerheads as illustrated in FIG. 4 allows a substrate to be processed in a combinatorial manner wherein different parameters can be varied as discussed above. Examples of the parameters comprise process material composition, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. FIG. 5 illustrates one example of a pattern of site isolated regions that can be processed using a small spot showerhead apparatus in accordance with some embodiments of the present invention. In FIG. 5, the substrate is still generally divided into four quadrants and within each quadrant, three site isolated regions can be processed using small spot showerheads as illustrated in FIG. 4, yielding twelve site isolated regions on the substrate. Therefore, in this example, twelve independent experiments could be performed on a single substrate.

Figure 6:
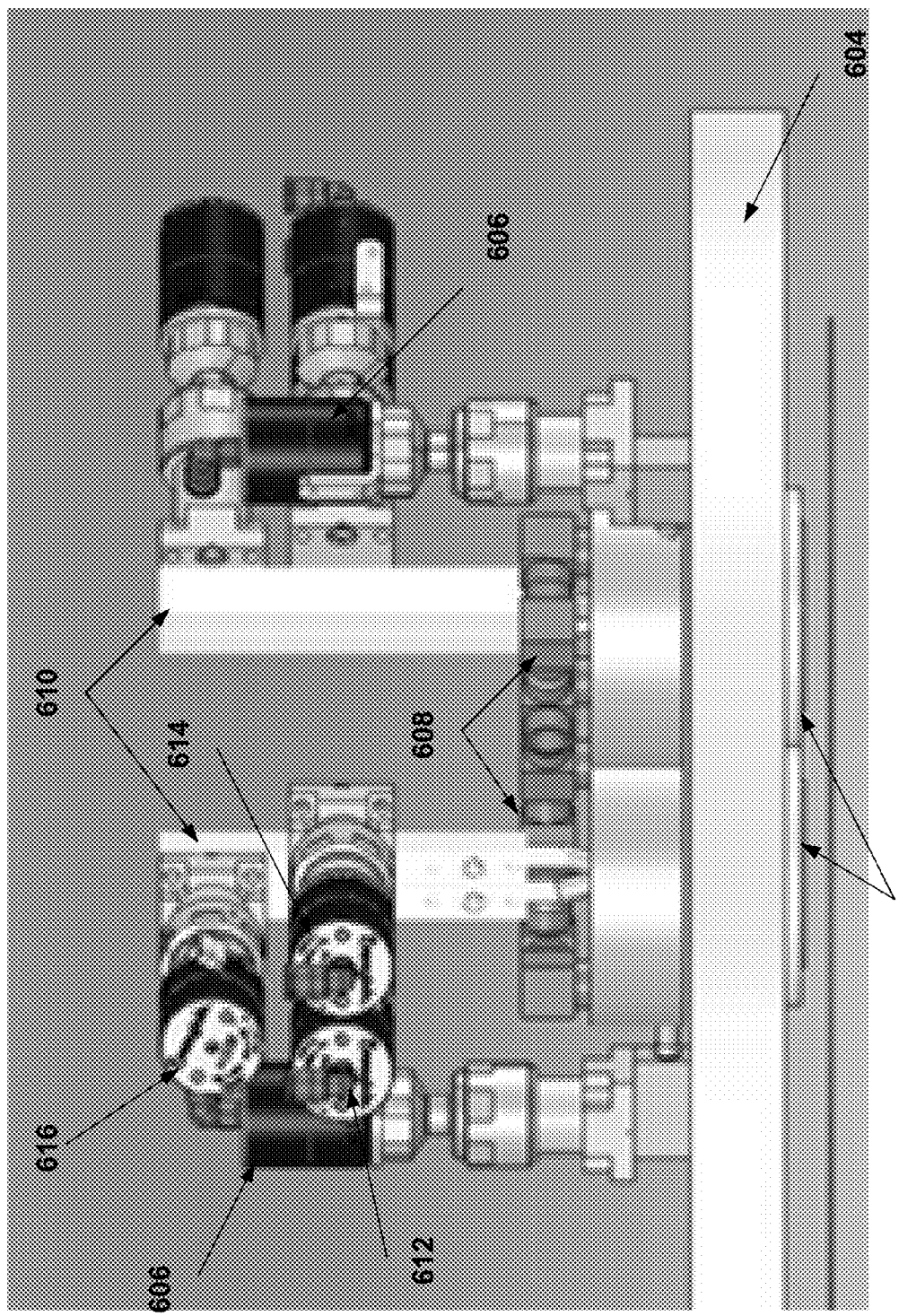
FIG. 6 illustrates a side view of two examples of a small spot showerhead apparatus in accordance with some embodiments of the present invention.

FIG. 6 illustrates a side view of two examples of a small spot showerhead apparatus in accordance with some embodiments of the present invention. For illustration purposes, two small spot showerhead assemblies are shown. As discussed previously, any number of spot showerhead assemblies may be used, limited only by practical constraints such as chamber size, small spot showerhead assembly size, substrate size, etc. In FIG. 6, two small spot showerheads, 602, are illustrated as being mounted on the bottom of a chamber lid, 604. The showerheads will be as described previously with respect to FIG. 4. Each small spot showerhead assembly will have an independent gas distribution system. Valves to control the introduction of the purge gas to the purge holes (404 in FIG. 4) are illustrated at 606. Each showerhead assembly will have independent purge capability. The conduits that deliver the gases to showerhead assemblies are not shown for simplicity. Each showerhead assembly will have a ring of independent exhaust holes (406 in FIG. 4). The manifolds for the exhaust rings are illustrated at 608. The reactive gases are delivered to each showerhead assembly through a gas delivery manifold, 610. Each showerhead assembly will have an independent gas delivery manifold. The configuration illustrated in FIG. 6 delivers two reactive gases to each showerhead assembly. A first reactive gas is introduced through valve, 612. A second reactive gas is introduced through valve, 614. Additionally, each gas delivery manifold will have a purge capability wherein an inert gas is used to purge the manifold and is introduced through valve, 616. The details of the construction of the manifolds, the valves, and the gas delivery are well known in the art and will not be described herein in detail. Although two reactive gases are illustrated in FIG. 6, those skilled in the art will understand that any number of reactive gases may be supplied to gas delivery manifold, 610, for introduction into the process chamber.

Figure 7:
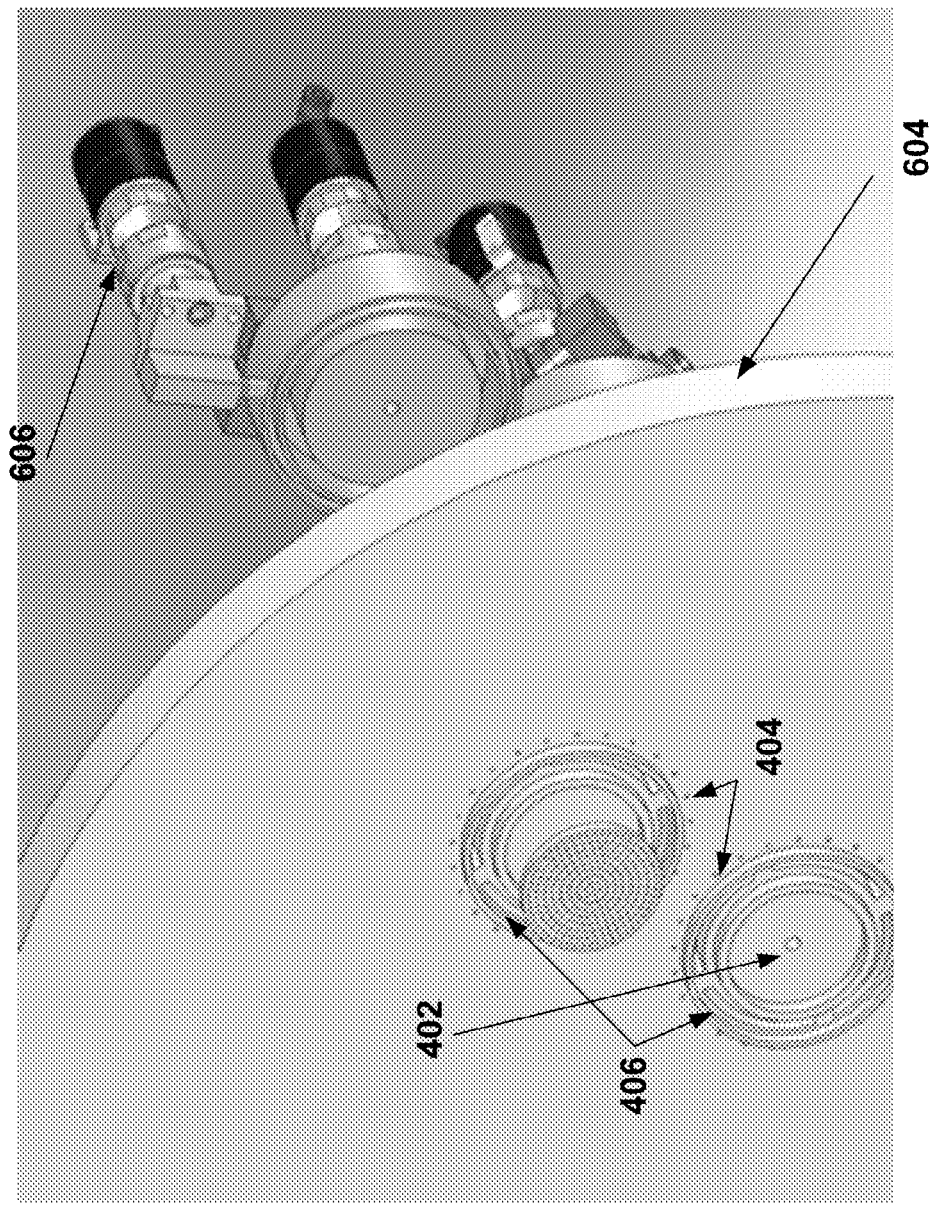
FIG. 7 illustrates a bottom view of two examples of a small spot showerhead apparatus in accordance with some embodiments of the present invention.

FIG. 7 illustrates a bottom view of two examples of a small spot showerhead apparatus in accordance with some embodiments of the present invention. FIG. 7 gives an additional perspective of the small spot showerheads mounted on or integrated into the chamber lid, 604 and their associated gas delivery systems. Illustrated in FIG. 7 are the gas distribution holes, 402, the purge holes, 404, and the exhaust channels, 406. Also illustrated is one of the valves, 606, for the purge holes.

Although the chamber lid, 604, is illustrated as being solid in FIG. 7, in some embodiments of the present invention, the chamber lid comprises large area, combinatorial showerhead sections as discussed previously with respect to FIG. 3. In this configuration, large area (i.e. quadrant) processing can be combined with the small spot processing to allow multilayer films stacks to be screened in a combinatorial manner as discussed previously. Apparatus of combining large area (i.e. quadrant) processing with the small spot processing are described in U.S. patent application Ser. No. 13/302,097, filed on Nov. 22, 2011 and is herein incorporated by reference for all purposes.

Figure 8:
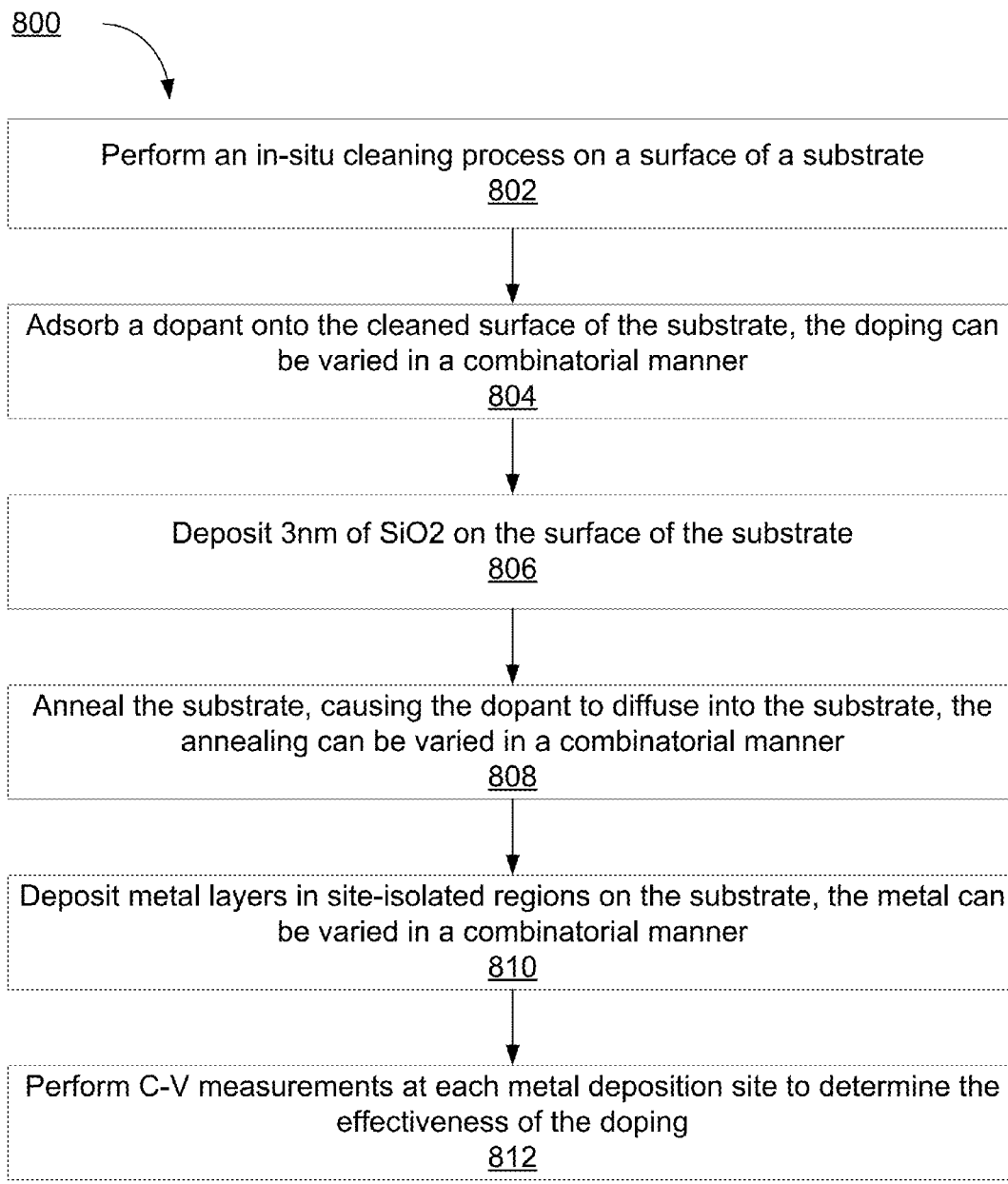
FIG. 8 presents a flow chart for methods according to some embodiments.

FIG. 8 presents a flow chart for methods according to some embodiments. In step 802, a substrate is provided to a process chamber and an in-situ clean process is performed on a surface of the substrate. The substrate may be any one of a silicon, germanium, silicon-germanium alloy, or III-V substrate. In some embodiments, the substrate (e.g. silicon) may have one or more semiconductor layers (e.g. germanium or silicon-germanium alloy) deposited thereon. The substrate (or the semiconductor layer(s) may be n-type or p-type. Continuing with step 802, the in-situ clean process may be one or more of a plasma clean or a vapor clean. The in-situ clean process removes native oxide materials and other contaminants from the surface and prepares the surface for subsequent processing.

In step 804, dopants are adsorbed onto the cleaned surface of the substrate. Examples of suitable dopants for silicon, germanium, and silicon-germanium alloys include phosphorous, boron, and arsenic. Typical sources for these dopants include phosphine, diborane, and arsine. Examples of suitable dopants for III-V compounds include silicon, and sulfur. Typical sources for these dopants include silane, disilane, trisilane, and hydrogen sulfide. The dopants are delivered in the gas phase through a large area showerhead apparatus as discussed previously. Process parameters such as the dopant composition, dopant concentration, dopant source gas, and exposure time can be varied in a combinatorial manner as discussed previously.

In step 806, a capping layer of silicon dioxide is deposited above the adsorbed dopant. The silicon dioxide capping layer may have a thickness of about 3 nm. The silicon dioxide capping layer is operable to prevent the loss of the dopant species during subsequent processing.

In step 808, the site-isolated regions of the substrate are annealed (e.g. for between about 1 second and 30 seconds) to drive the dopants into the substrate and/or the semiconductor layer, and to activate the dopants. Anneal processes where the area of the process can be controlled such as laser annealing or site-isolated rapid thermal processing (RTP) can be used. Methods and apparatus for using site-isolated rapid thermal processing (RTP) are described in co-owned and co-pending U.S. patent application Ser. No. 13/722,624, filed on Dec. 20, 2012. Process parameters such as temperature, duration, power and temperature ramp rate can be varied in a combinatorial manner among the site-isolated regions.

In step 810, metal layers can be deposited in the site-isolated regions using a physical vapor deposition technique such as sputtering, e-beam evaporation, or pulsed laser deposition and a shadow mask. Examples of suitable metals layers include titanium nitride, molybdenum, molybdenum nitride, and aluminum. The metal layers are operable as an electrode. The metal layers may include a substantially pure metal or may include conductive metal compounds such as conductive metal nitride materials. Process parameters such as metal composition, metal compound composition, and thickness may be varied in a combinatorial manner. As an example, different metals having different work functions can be varied.

In step 812, Capacitance-Voltage (C-V) measurements are made in each site-isolated region to determine the effectiveness of the doping process.

Figure 9A:
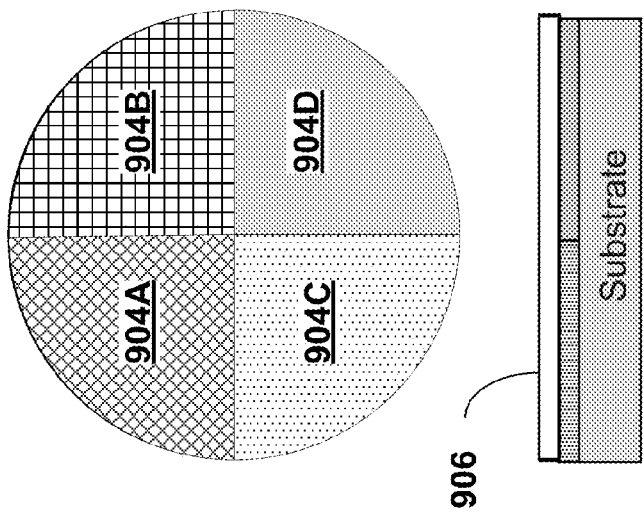
FIGS. 9A-9E illustrates an exemplary sequence for forming film stacks according to some embodiments.

FIGS. 9A-9E illustrate an exemplary sequence for forming film stacks according to some embodiments. A sequence for forming a simple film stack comprising a substrate, a dielectric material, and an electrode material to form a simple capacitor stack will be used as an example. Those skilled in the art will understand that the substrate may already have several layers and/or structures formed thereon. FIG. 9A begins with the substrate, 902, wherein the substrate (or a previous material deposited thereon) is operable as a first electrode of the capacitor stack. In FIG. 9A, the surface of the substrate has been subjected to an in-situ clean process as discussed previously.

Figure 9B:
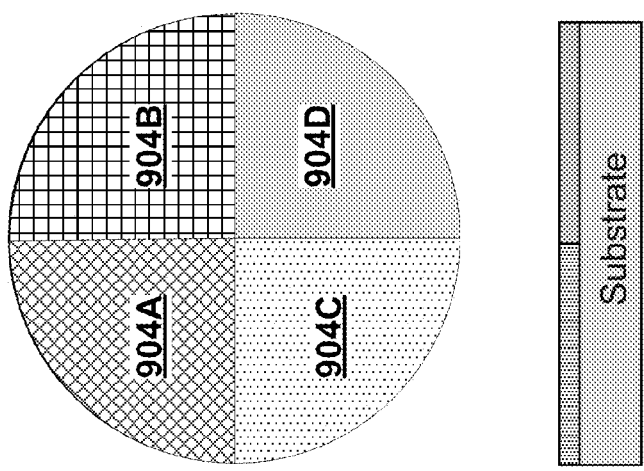

In FIG. 9B, the substrate is exposed to four alternatives of a dopant as discussed previously. As illustrated in FIG. 9B, the four alternatives are formed in each of four sections, 904A-904D, across the substrate surface respectively. This may be accomplished using a combinatorial deposition chamber. In the combinatorial deposition chamber, each of the large area showerhead sections, (i.e. as described previously), would be used to deposit one of the four alternatives on the substrate. Process parameters such as the dopant composition, dopant concentration, dopant source gas, and exposure time can be varied in a combinatorial manner as discussed previously.

Figure 9C:
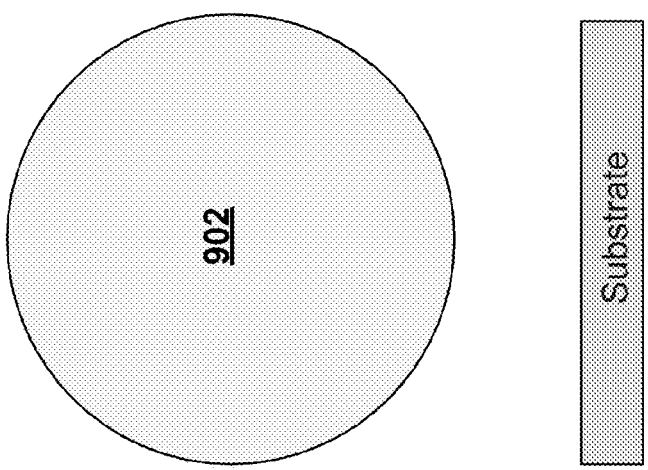

In FIG. 9C, a capping layer of silicon dioxide, 906, is deposited above the adsorbed dopant across the entire substrate. The silicon dioxide capping layer may have a thickness of about 3 nm. The silicon dioxide capping layer is operable to prevent the loss of the dopant species during subsequent processing.

Figure 9D:
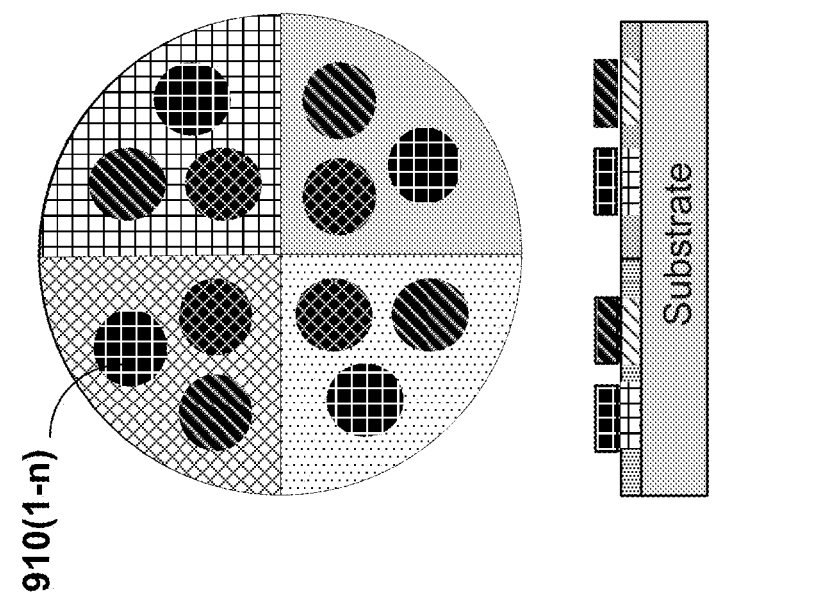

In FIG. 9D, site-isolated regions of the substrate, 908 (1-$n$), are annealed to drive the dopants into the substrate and/or the semiconductor layer, and to activate the dopants. Anneal processes where the area of the process can be controlled such as laser annealing or site-isolated rapid thermal annealing (RTA) can be used. FIG. 9D illustrates twelve annealing experiments. Process parameters such as temperature, duration, power and temperature ramp rate can be varied in a combinatorial manner among the site-isolated regions. In some embodiments, the varying of the process parameters includes not annealing a site-isolated region.

Figure 9E:
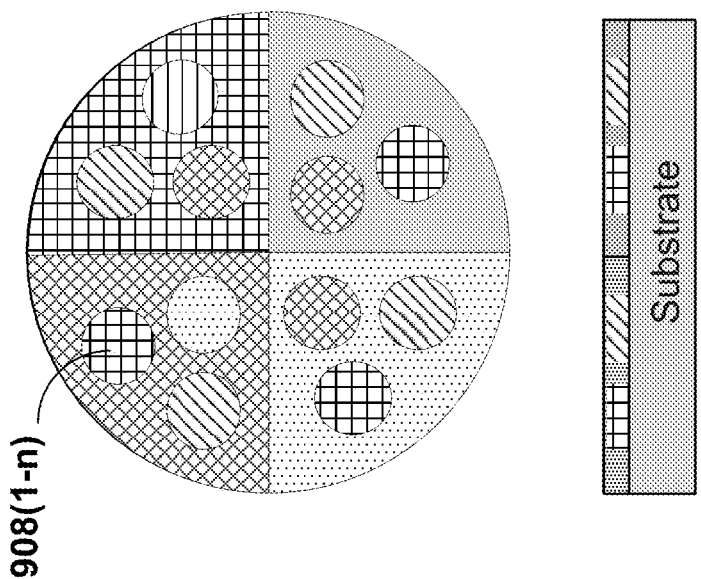

In FIG. 9E, metal layers can be deposited in the site-isolated regions, 910 (1-$n$), using a physical vapor deposition technique such as sputtering, e-beam evaporation, or pulsed laser deposition and a shadow mask. The metal layers are operable as an electrode of a simple metal-insulator-semiconductor (MIS) capacitor. The metal layers may include a substantially pure metal or may include conductive metal compounds such as conductive metal nitride materials. As illustrated in FIG. 9E, the metal layer is deposited in small spots using a plurality of the small spot showerhead apparatus described previously. Advantageously, the plurality of small spot showerhead apparatus are integrated into large area, quadrant showerheads as described previously. FIG. 9E illustrates twelve metal electrode experiments. Process parameters such as metal composition, metal compound composition, and thickness may be varied in a combinatorial manner. As an example, different metals having different work functions can be varied.

Capacitance-Voltage (C-V) measurements are made in each site-isolated region to determine the effectiveness of the doping process. Each of the twelve MIS capacitors would then be tested to determine the optimum doping material and/or processing conditions. Typical tests may comprise measuring capacitance as a function of applied voltage (i.e. C-V curve), measuring current as a function of applied voltage (i.e. I-V curve), measuring the concentration and energy levels of traps or interface states, measuring the concentration and mobility of charge carriers, etc.

FIGS. 9A-9E used a simple capacitor stack to illustrate various deposition sequences for forming film stacks. These methods may be applied to specific devices that are of technological importance.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for doping in a combinatorial manner, the method comprising:
    providing a substrate;
    applying an in-situ clean to a surface of the substrate;
    after the applying, exposing one or more first site-isolated regions on the surface of the substrate to a dopant, wherein the exposing can be varied in a combinatorial manner;
    after the exposing, forming a silicon dioxide layer above each of the first site-isolated regions;
    after the forming, annealing one or more second site-isolated regions defined within each of the first site-isolated regions using one of laser annealing or site-isolated rapid thermal annealing, wherein the annealing can be varied in a combinatorial manner;
    after the annealing, depositing a conductive layer within each of the second site-isolated regions, wherein the depositing can be varied in a combinatorial manner; and
    after the depositing, measuring a property within each of the second site-isolated regions.

2. The method of claim 1 wherein the substrate is one of silicon, germanium or a silicon-germanium alloy.

3. The method of claim 1 wherein an area of each of the second site-isolated regions is smaller than an area of each of the first site-isolated regions.

4. The method of claim 1 wherein a composition of the dopant is varied between at least two of the first isolated regions.

5. The method of claim 1 wherein a concentration of the dopant is varied between at least two of the first isolated regions.

6. The method of claim 1 wherein a source gas of the dopant is varied between at least two of the first isolated regions.

7. The method of claim 1 wherein an exposure time of the dopant is varied between at least two of the first isolated regions.

8. The method of claim 1 wherein the annealing comprises laser annealing and a temperature of the annealing is varied between at least two of the second isolated regions.

9. The method of claim 1 wherein the annealing comprises laser annealing and a time of the annealing is varied between at least two of the second isolated regions.

10. The method of claim 1 wherein the annealing comprises laser annealing and a temperature ramp rate of the annealing is varied between at least two of the second isolated regions.

11. The method of claim 1 wherein the annealing comprises laser annealing and a power of the annealing is varied between at least two of the second isolated regions.

12. The method of claim 1 wherein the annealing comprises site-isolated rapid thermal processing and a temperature of the annealing is varied between at least two of the second isolated regions.

13. The method of claim 1 wherein the annealing comprises site-isolated rapid thermal processing and a time of the annealing is varied between at least two of the second isolated regions.

14. The method of claim 1 wherein the annealing comprises site-isolated rapid thermal processing and a temperature ramp rate of the annealing is varied between at least two of the second isolated regions.

15. The method of claim 1 wherein the annealing comprises site-isolated rapid thermal processing and a power of the annealing is varied between at least two of the second isolated regions.

16. The method of claim 1 wherein the conductive layer is a metal and a composition of the metal is varied between at least two of the second isolated regions.

17. The method of claim 1 wherein the conductive layer is a metal compound and a concentration of the metal is varied between at least two of the second isolated regions.

18. The method of claim 1 wherein a thickness of the conductive layer is varied between at least two of the second isolated regions.

19. The method of claim 1 wherein the measuring of the property comprises measuring at least one of: capacitance as a function of applied voltage, current as a function of applied voltage, concentration and energy levels of traps or interface states, or concentration and mobility of charge carriers.

20. The method of claim 19 wherein the measuring of the property comprises measuring capacitance as a function of applied voltage.

* * * * *